(12) United States Patent
Chen

(10) Patent No.: US 7,731,505 B2
(45) Date of Patent: Jun. 8, 2010

(54) THREE-DIMENSIONAL CONNECTOR FOR A COORDINATE INPUT DEVICE

(75) Inventor: Chih-Cheng Chen, Yung Kang (TW)

(73) Assignee: Super Elite Technology Company Limited, Yung Kang Industrial District (TW)

(*) Notice: Subject to any disclaimer, the term of this patent is extended or adjusted under 35 U.S.C. 154(b) by 0 days.

(21) Appl. No.: 11/968,166

(22) Filed: Jan. 1, 2008

(65) Prior Publication Data

US 2008/0102688 A1    May 1, 2008

(30) Foreign Application Priority Data

Sep. 19, 2006    (TW) ............... 95134544 A

(51) Int. Cl.
 *H01R 12/00* (2006.01)
(52) U.S. Cl. ...................... 439/67; 361/749
(58) Field of Classification Search ............ 439/67, 439/77; 361/749
See application file for complete search history.

(56) References Cited

U.S. PATENT DOCUMENTS

| | | | |
|---|---|---|---|
| 3,934,959 A * | 1/1976 | Gilissen ................ 439/77 |
| 5,860,813 A * | 1/1999 | Irlbeck et al. ............ 439/67 |
| 6,342,932 B1 * | 1/2002 | Terao et al. ............. 349/58 |
| 6,751,859 B2 * | 6/2004 | Farnworth et al. ......... 29/842 |
| 6,792,679 B1 * | 9/2004 | Tai et al. ............... 29/877 |
| 7,070,421 B2 * | 7/2006 | Nozaki et al. ............ 439/67 |
| 7,381,060 B2 * | 6/2008 | Ju .................... 439/66 |

\* cited by examiner

*Primary Examiner*—Thanh-Tam T Le

(57) ABSTRACT

A three-dimensional connector for a coordinate input device, which provides a touch pad and a support plate under said touch pad, includes a flat conductor cable. The flat conductor cable has an end connecting with the touch pad and another end providing a plurality of conductive lines. Each of the conductive lines corresponds to and is perpendicularly penetrated with a connecting pin; said connecting pin has a head section to press-fit with said flat conductor cable, extends through a slot, which is provided at the support plate next to said touch pad, to act as a contact such that said flat conductor cable is capable of transmitting electronic signal along a direction perpendicular to said flat conductor cable. Hence, the flat conductor cable can be connected firmly without loosening so as to enhance compactness of the three-dimensional connector substantially.

3 Claims, 6 Drawing Sheets

THREE-DIMENSIONAL CONNECTOR FOR A COORDINATE INPUT DEVICE

BACKGROUND OF THE INVENTION

1. Field of the Invention

The present invention is related to a three-dimensional connector for a coordinate input device and particularly to a three-dimensional connector, which is connected to and perpendicular to a flat conductor cable to enhance compactness.

2. Brief Description of the Related Art

There are conventional touch pads available in the market such as the resistance touch pad, the capacitance touch pad, the infrared touch pad, the supersonic touch pad and the inductance touch pad. The connecting end of the flat cable is provided with either the male-female connector or the locking type connector.

However, the common feature of the previous connection ways is in that a flat cable with an optional length is connected to one of connectors of a control card and another connector of the control card is connected to an input port of a personal computer with another conductor cable. Although the conventional connecting ways are simple and convenient, deficiencies such as incomplete contacting, the flat cable being excessive long, having weak signal and the flat cable loosening and breaking easily keep bothering the users and the suppliers.

SUMMARY OF THE INVENTION

In order to overcome the deficiencies of the preceding prior art, an object of the present invention is to provide a three-dimensional connector for a coordinate input device with which the flat cable can be connected perpendicularly to enhance steadiness in use.

Another object of the present invention is to provide a three-dimensional connector for a coordinate input device with which the flat cable can be shortened to enhance compactness and integrity of the flat cable connection.

A further object of the present invention is to provide an easily assembled three-dimensional connector for a coordinate input device with lower production cost.

Accordingly, a three-dimensional connector for a coordinate input device in accordance with the present invention includes a flat conductor cable. The flat conductor cable has an end connecting with the touch pad and another end providing a plurality of conductive lines. Each of the conductive lines corresponds to and is perpendicularly penetrated with a connecting pin; the connecting pin has a head section to press-fit with the flat conductor cable and extends through a slot, which is provided at the support plate of the touch pad, to act as a contact such that the flat conductor cable is capable of transmitting electronic signal along a direction perpendicular to the flat conductor cable. Hence, the flat conductor cable can be connected firmly without loosening so as to enhance compactness of the three-dimensional connector substantially.

Further, a three-dimensional connector for a coordinate input device in accordance with the present invention includes a flat conductor cable with a first end being connected to the touch pad and a second end passing through a slot, which is provided at the support and disposed next to a side of the support plate, and forming a naked-copper connector at the bottom of said support plate.

In addition, a three-dimensional connector for a coordinate input device includes a flat conductor cable with a first end being connected to the touch pad and a second end forming a soldered conductive contact head perpendicular to the flat conductor cable to pass through a slot, which is provided at the support disposed next to a side of said support plate, such that a shortened length of said conductor cable is obtained.

BRIEF DESCRIPTION OF THE DRAWINGS

The detail structure, the applied principle the function and the effectiveness of the present invention can be more fully understood with reference to the following description and accompanying drawings, in which.

DETAILED DESCRIPTION OF THE INVENTION

Figure 1:
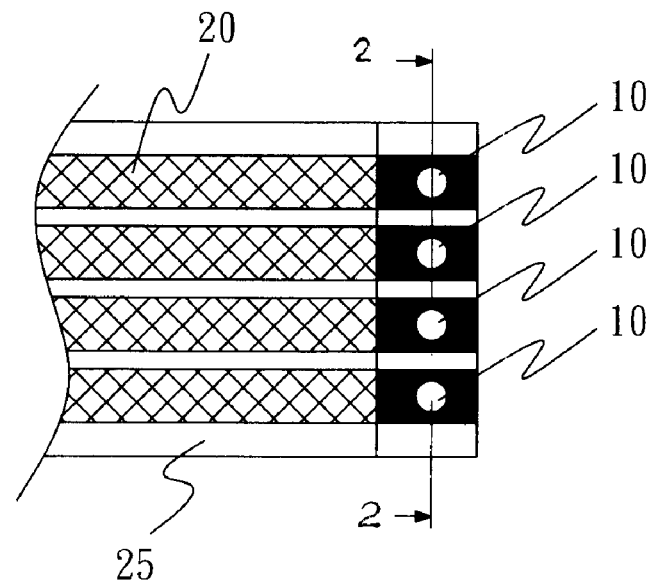
FIG. 1 is a fragmentary front view of the first embodiment of a three-dimensional connector for a coordinate input device according to the present invention.
Figure 2:
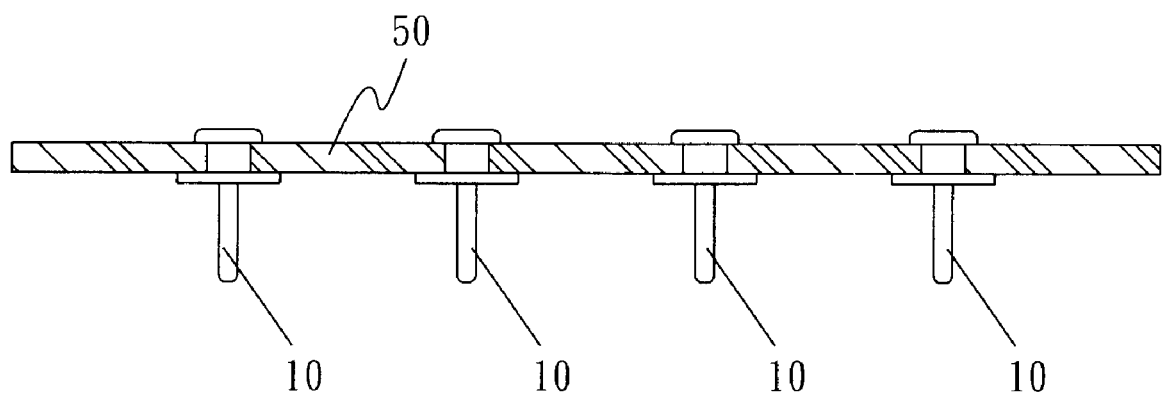
FIG. 2 is a sectional view along line 2-2 of FIG. 1.
Figure 3:
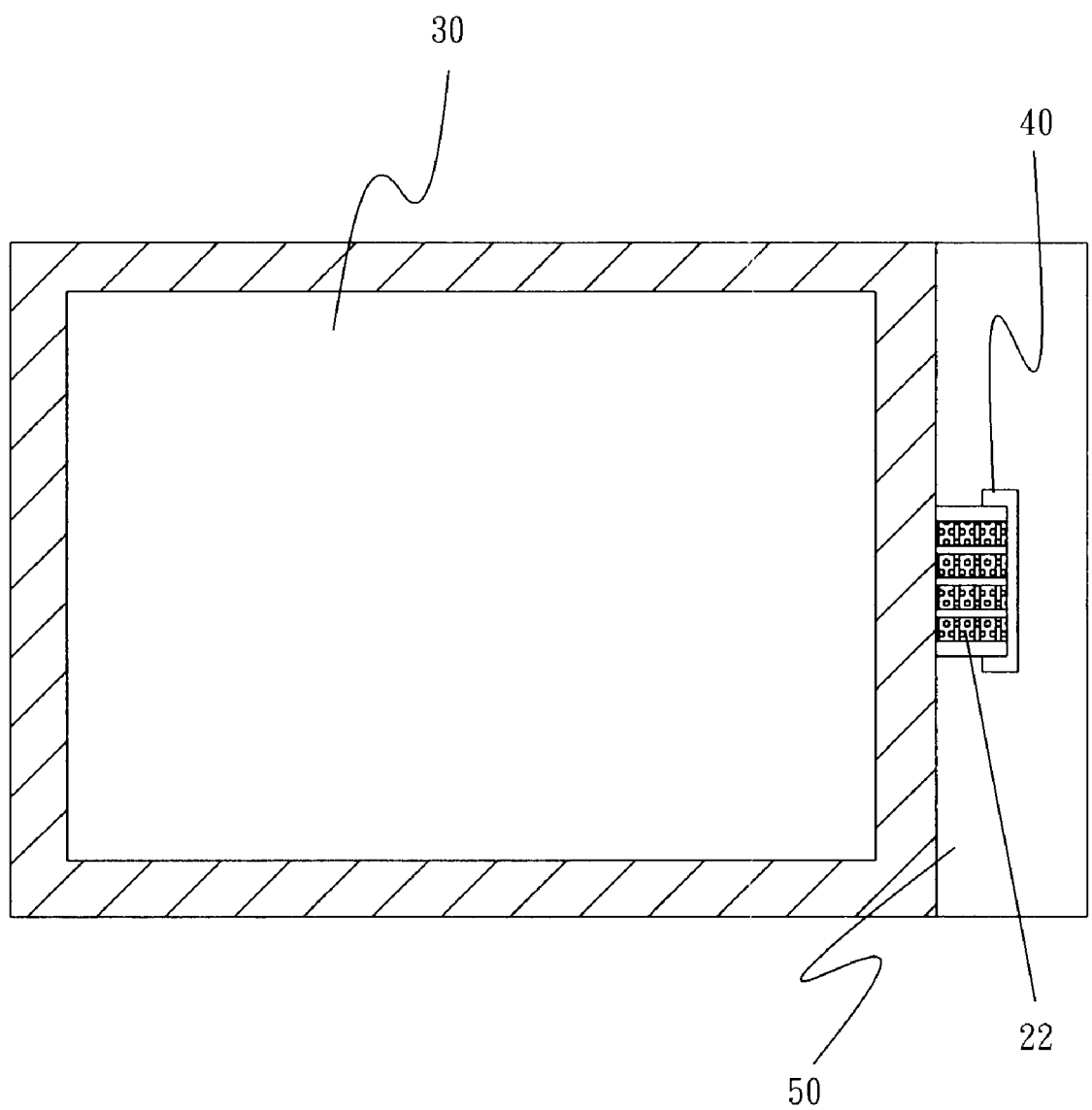
FIG. 3 is a partly sectional view illustrating the second embodiment of a three-dimensional connector for a coordinate input device according to the present invention.
Figure 4:
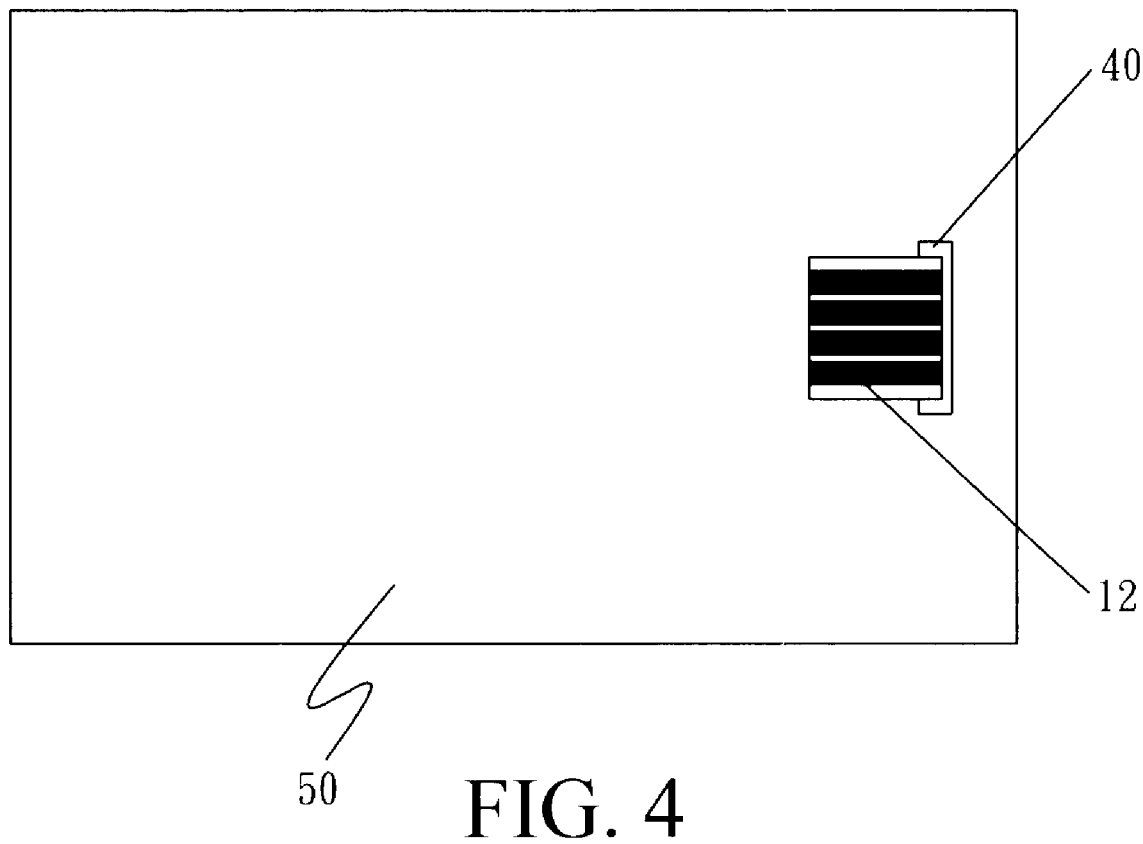
FIG. 4 is a rear view of the forward arrangement type of the second embodiment according to the present invention.
Figure 5:
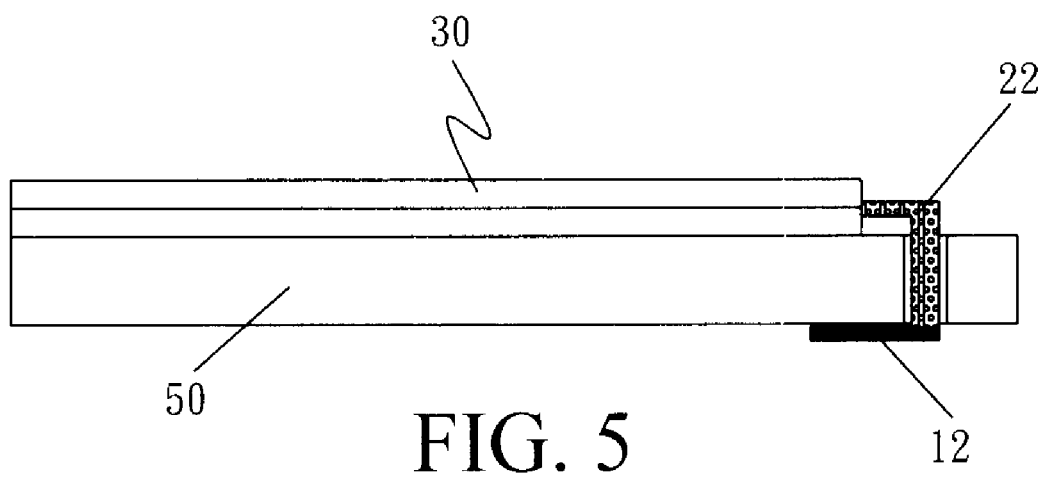
FIG. 5 is a side view of the forward arrangement type of the second embodiment according to the present invention.

Referring to FIGS. 1 and 2, the first embodiment of a three-dimensional connector for a coordinate input device according to the present invention provides a flat conductor cable 25 with an end thereof connecting with a touch pad (not shown) and another end having a plurality of conductive lines 20. Each of the conductive lines 20 is pressingly attached with a vertical guide pin 10 and the vertical guide pin 10 perpendicularly extends through a support plate 50 such that the flat conductor cable 25 is capable of guiding electronic signal in a direction perpendicular to the flat conductor cable 25. Due to the vertical guide pin 10 having a conductor contact along a direction perpendicular to the flat conductor cable 25, the structure of the flat conductor cable 25 is simplified substantially such that not only the length of the flat cable and the connected area and the time needed can be reduced advantageously while the flat cable being connected but also the flat conductor cable 25 can be fabricated with much easier way.

Figure 6:
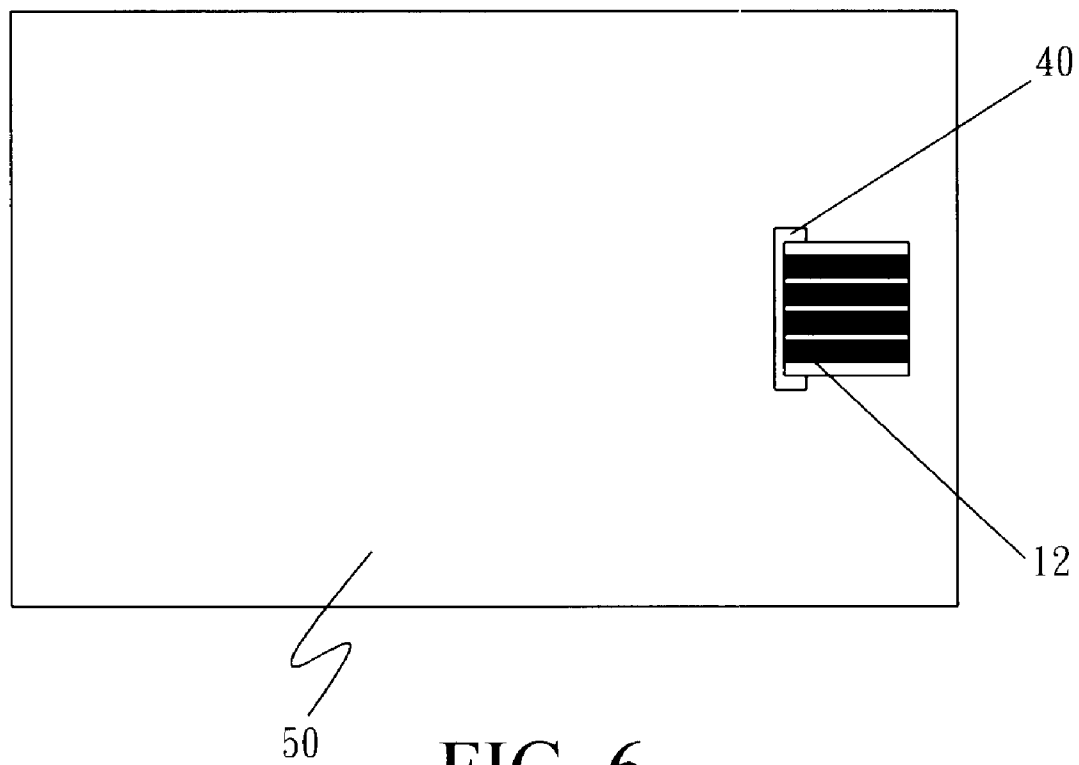
FIG. 6 is a rear view of the backward arrangement type of the second embodiment according to the present invention.
Figure 7:
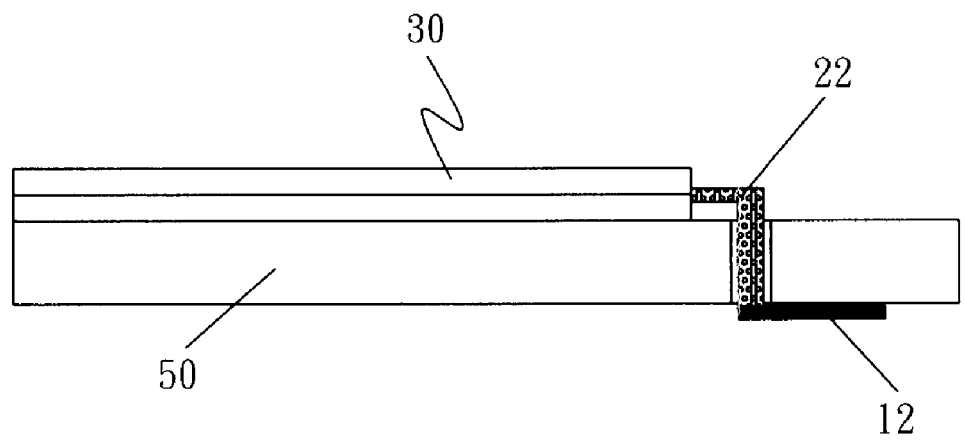
FIG. 7 is a side view of the backward arrangement type of the second embodiment according to the present invention.

Referring to FIGS. 3 to 7, the second embodiment of the present invention is illustrated. It can be seen in FIGS. 3 to 5 that a three-dimensional connector is formed of a flexible flat conductor cable 22 such as a flexible circuit board (FCB) or a flexible flat cable (FFC) with a naked-copper contact type connector 12 instead of flat plane type connector. An end of the flexible flat conductor cable 22 is connected to a lateral side of a touch pad 30 disposed on the top of a support plate 50. The other end of the flexible flat conductor cable 22 is connected to the necked-copper contact type connector 12, which is attached to the bottom of the support plate 50. The support plate 50 has a slot 40 disposed between the touch pad 30 and a lateral side of the support plate 50 for the other end of the flexible flat conductor cable 22 being capable of passing through the slot 40 and extending to the bottom of the support plate 50 and being joined to an end of the naked-copper contact type connector 12 right under the slot 40. It is noted that the other end of the necked-copper contact type connector 12 is disposed to extend away from the lateral side of the support plate. The arrangement of the copper contact type connector 12 illustrated in FIGS. 6 and 7 is similar to the arrangement shown in FIGS. 4 and 5. The difference of the arrangement shown in FIGS. 6 and 7 is in that the other end of the naked-copper contact type connector 12 is disposed to extend toward the lateral side of the support plate 50. The three-dimensional connector of the second embodiment has simplified the structure of the flat cable such that it is easier for the flat cable being connected. Further, the naked-copper contact type connector 12 is capable of transmitting the electronic signal of the touch pad 30 accurately and it lowers the chance of the signal being degraded and enhances the life span of the touch pad 30.

Figure 8:
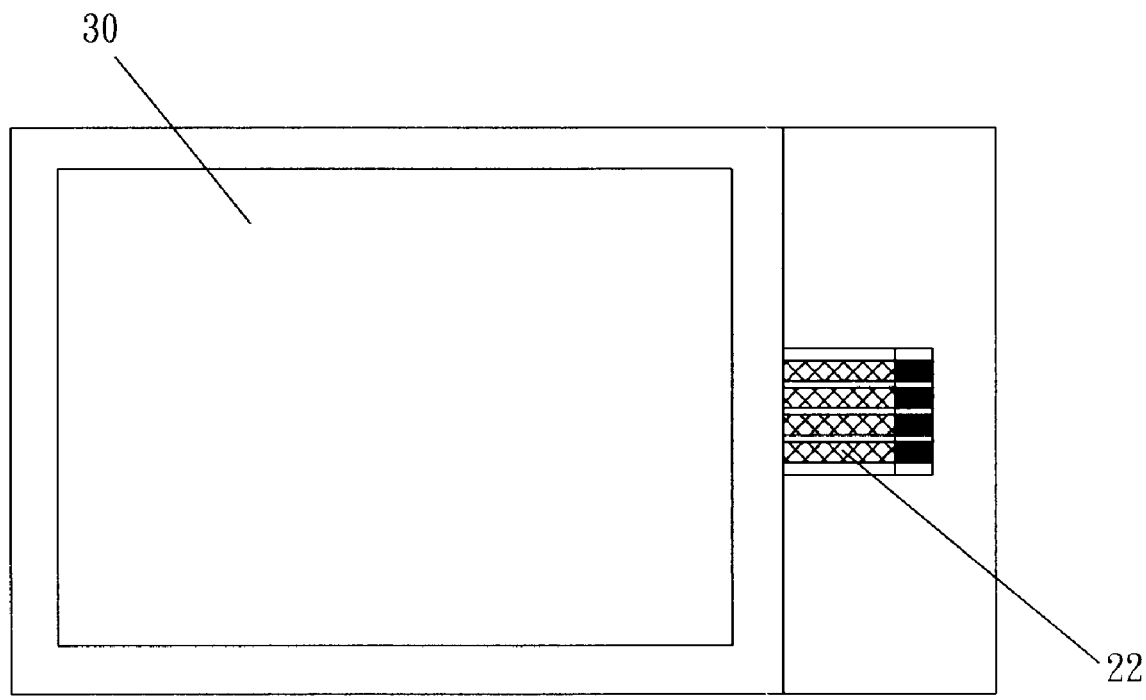
FIG. 8 is a plan view of the third embodiment according to the present invention.
Figure 9:
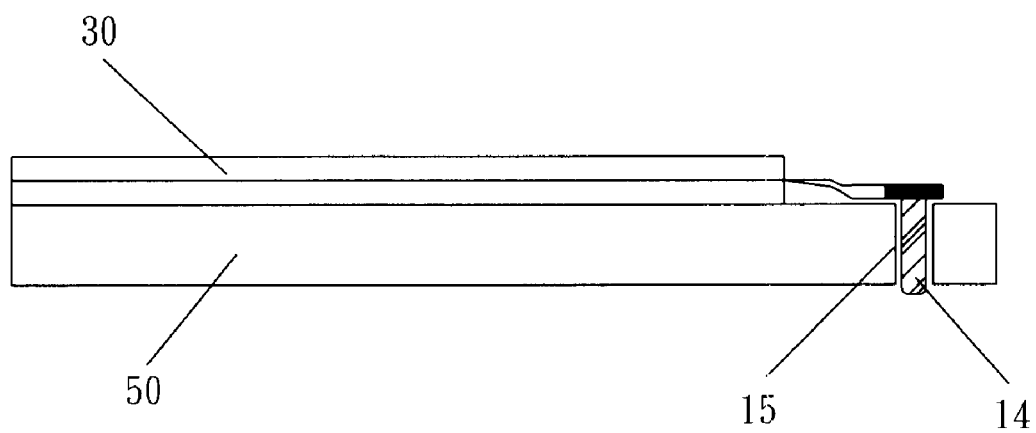
FIG. 9 is a side view of the third embodiment according to the present invention.

Referring to FIGS. 8 and 9, the third embodiment of the present invention is illustrated. The three-dimensional connector of the third embodiment provides flexible flat conductor cable 22 such as FCB or FFC with an end thereof being connected to a touch pad 30 on a support plate 50 and another and of the flexible flat conductor cable 22 is soldered with a conductive contact head 14, which is perpendicular to the flexible flat conductor cable 22. A slot 15 is provided at the support plate 50 corresponds to the conductive contact head 14 for the conductive contact head 14 passing through to perform task of contact. In this way, the flexible flat conductor cable 22 can be shortened substantively and the electroconductibility thereof is much better than the copper contact.

Figure 10:
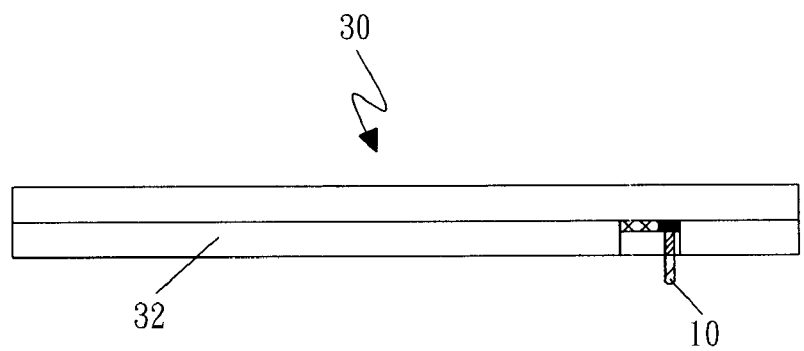
FIG. 10 is a side view of the fourth embodiment according to the present invention.
Figure 11:
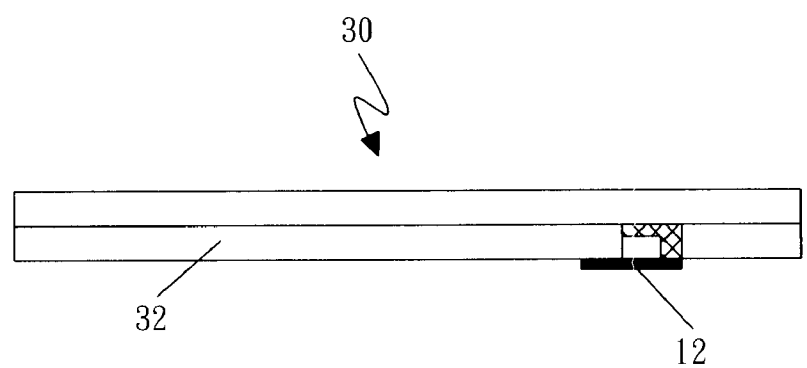
FIG. 11 is a side view of the fifth embodiment according to the present invention.
Figure 12:
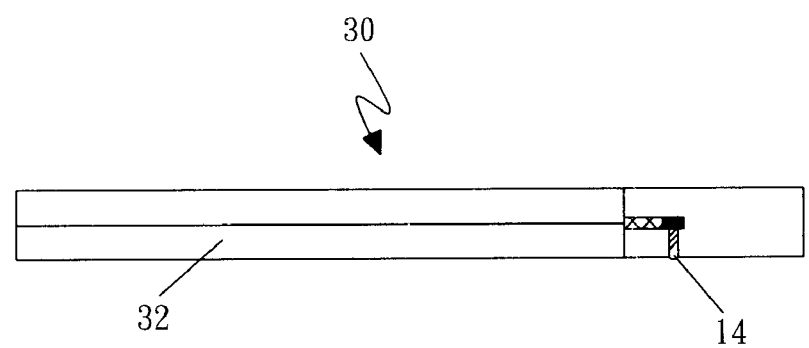
FIG. 12 is a side view of the third embodiment according to the present invention.

Referring to FIGS. 10 to 12, the lower plate 32 of the touch pad 30 is extended to replace the support plate shown in the previous embodiments of the present invention. Hence, the fourth embodiment shown in FIG. 10 can be used instead of the first embodiment shown in FIGS. 1 and 2. The fifth embodiment shown in FIG. 11 can be used for replacing the second embodiment shown in FIGS. 3 to 7. The sixth embodiment shown in FIG. 12 can be used instead of the third embodiment shown in FIGS. 8 and 9.

It is appreciated that a three-dimensional connector for a coordinate input device according to the present invention is provided in a form of a vertical guide pin, a connecting head or a vertical conductive contact to allow the connecting flat cable of a touch pad being connected firmly without loosening or breaking and shortening length of the flat cable such that deficiencies of the conventional connector such as undesirable contact, excessive length, weak signal transmission, frequent loosening and breaking can be overcome effectively.

While the invention has been described with referencing to the preferred embodiments thereof, it is to be understood that modifications or variations may be easily made without departing from the spirit of this invention, which is defined by the appended claims.

What is claimed is:

1. A three-dimensional connector for a coordinate input device having a touch pad disposed on the top of a support plate, comprising:
    a flat conductor cable with a first end and a second end, wherein said first end is connected to a lateral side of said touch pad;
    a slot being disposed at said support plate between said touch pad and a lateral side of said support plate for said second end being capable of passing through said slot and extending to the bottom of said support plate; and
    a naked-copper contact type connector having a third end and a forth end being opposite to each other, and being attached to the bottom of said support plate, wherein said third end is joined to said second end right under said slot.

2. The three-dimensional connector for a coordinate input device as defined in claim 1, wherein said fourth end is disposed away from the lateral side of said support plate.

3. The three-dimensional connector for a coordinate input device as defined in claim 1, wherein said fourth end is disposed toward the lateral side of said support plate.

* * * * *